(12) United States Patent
Chiu et al.

(10) Patent No.: US 12,518,990 B2
(45) Date of Patent: Jan. 6, 2026

(54) WAFER CARRIER MEASURING APPARATUS

(71) Applicant: GUDENG PRECISION INDUSTRIAL CO., LTD., New Taipei (TW)

(72) Inventors: Ming-Chien Chiu, New Taipei (TW); Chia-Ho Chuang, New Taipei (TW); Kuo-Hua Lee, New Taipei (TW); Xin-Yuan Huang, New Taipei (TW); En-Nien Shen, New Taipei (TW); Jyun-Ming Lyu, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 295 days.

(21) Appl. No.: 18/372,202

(22) Filed: Sep. 25, 2023

(65) Prior Publication Data

US 2024/0186163 A1   Jun. 6, 2024

Related U.S. Application Data

(60) Provisional application No. 63/429,218, filed on Dec. 1, 2022.

(51) Int. Cl.
*H01L 21/67* (2006.01)
*H01L 21/673* (2006.01)

(52) U.S. Cl.
CPC .. *H01L 21/67288* (2013.01); *H01L 21/67253* (2013.01); *H01L 21/67259* (2013.01); *H01L 21/67389* (2013.01); *H01L 21/67393* (2013.01)

(58) Field of Classification Search
CPC ......... H01L 21/67288; H01L 21/67253; H01L 21/67259; H01L 21/67389; H01L 21/67393
See application file for complete search history.

(56) References Cited

U.S. PATENT DOCUMENTS 11,251,063 B2 * 2/2022 Su ..................... H01L 21/67718
12,374,573 B2 * 7/2025 Matsutori ......... H01L 21/67389
(Continued)

FOREIGN PATENT DOCUMENTS

CN        104249898 A  * 12/2014    ....... H01L 21/67769
JP      2006114761 A  *  4/2006
(Continued)

OTHER PUBLICATIONS

CN-104249898-A, English Translation (Year: 2014).*
(Continued)

*Primary Examiner* — Ryan D Walsh
(74) *Attorney, Agent, or Firm* — Troutman Pepper Locke LLP; Tim Tingkang Xia, Esq.

(57) ABSTRACT

The present invention provides a measuring apparatus for measuring a wafer carrier having an opening end and at least one gas tower deposited inside, the measuring apparatus comprising a carrying interface for securing the wafer carrier. The opening end of the wafer carrier faces an inspection space of measuring apparatus. The carrying interface having a gas supplying assembly connected to a base of the wafer carrier so as to supply gas to the wafer carrier. The internal of the inspection space disposed a measuring assembly which is mainly used to measure gas flow rate from the gas tower in the accommodating space. The measuring assembly comprises a plurality of wind speed sensing elements and a plurality of displacement sensing element, which are fitted to the a second connecting element.

10 Claims, 10 Drawing Sheets

(56) References Cited

U.S. PATENT DOCUMENTS

| | | | |
|---|---|---|---|
| 2001/0042439 A1* | 11/2001 | Roberson, Jr. | H01L 21/67017 |
| | | | 96/111 |
| 2017/0049284 A1* | 2/2017 | Wang | A47L 9/02 |
| 2018/0102268 A1* | 4/2018 | Sekiya | H01L 21/67288 |
| 2019/0229000 A1* | 7/2019 | Kuan | H01L 21/67389 |

FOREIGN PATENT DOCUMENTS

| | | | | | |
|---|---|---|---|---|---|
| JP | 2010166077 | A | * | 7/2010 | ....... H01L 21/67772 |
| JP | 2013167451 | A | * | 8/2013 | |
| JP | 2015126203 | A | * | 7/2015 | |
| JP | 2015535660 | A | * | 12/2015 | ....... H01L 21/67389 |
| JP | 2019216258 | A | * | 12/2019 | ....... H01L 21/67393 |
| JP | 2020115591 | A | * | 7/2020 | |
| KR | 20060033155 | A | * | 4/2006 | ....... H01L 21/67265 |
| KR | 20120109413 | A | * | 10/2012 | ........... H01L 21/673 |
| KR | 20200020572 | A | * | 2/2020 | ....... H01L 21/67259 |

OTHER PUBLICATIONS

JP-2006114761-A, English Translation (Year: 2006).*
JP-2010166077-A, English Translation (Year: 2010).*
JP-2013167451-A, English Translation (Year: 2013).*
JP-2015126203-A, English Translation (Year: 2015).*
JP-2015535660-A, English Translation (Year: 2015).*
JP-2019216258-A, English Translation (Year: 2019).*
JP-2020115591-A, English Translation (Year: 2020).*
KR-20060033155-A, English Translation (Year: 2006).*
KR-20120109413-A, English Translation (Year: 2012).*
KR-20200020572-A, English Translation (Year: 2020).*

* cited by examiner

WAFER CARRIER MEASURING APPARATUS

CROSS-REFERENCE TO RELATED APPLICATIONS

This divisional application claims priority under 35 U.S.C. § 119(a) on Patent Application No(s). 63/429,218 filed in U.S. on Dec. 1, 2022 the entire contents of which are hereby incorporated by reference.

BACKGROUND OF THE INTENTION

Field of the Invention

The present invention relates to a measuring apparatus for wafer carrier, and more particularly to an apparatus for measuring gas flow data of gas towers inside a wafer carrier.

Description of the Prior Art

Referring to FIG. 1A and FIG. 1B a conventional wafer carrier C, includes a housing H with a top portion, a bottom portion, a back portion and two lateral portions. The housing H has an opening end OP. When a door (not shown in the diagrams) is coupled to the opening end OP of the wafer carrier C, the door and the housing H together define a hermetically sealed accommodating space $S_C$. Two supporting elements SM are disposed in the accommodating space $S_C$ and adapted to support a plurality of wafers (not shown in the diagrams). Furthermore, at least one gas tower GT is disposed in the accommodating space $S_C$, connected to the bottom portion of the housing H, and extended toward the top portion of the housing H.

The bottom portion of the wafer carrier C further includes a base B connected to an apparatus, thereby introducing a nonreactive dry gas G into the at least one gas tower GT via a valve (not shown in the diagrams) disposed in the base B, and the dry gas G can be diffused by the gas tower GT into the accommodating space $S_C$. In different processes of semiconductor process, the wafer carrier C is required to undergo steps, such as evacuation, gas exchange or gas refilling. However, during the assembly phase of the wafer carrier C or after the process phase of the wafer carrier C, the route of fluid may be clogged for various reasons to the detriment of the gas flow inside the wafer carrier C. For example, the diffusion rate at the top end and the bottom end of the gas tower GT are inconsistent, leading to a reduction in the total gas output of the gas tower GT. In case of a rupture of the gas tower GT during assembly thereof or a gas leak caused by poor tightness, the flow rate of the gas tower GT might be inconsistent. For instance, if the gas tower GT is not properly installed, the flow rate of the bottom portion of the gas tower GT will be higher in the course of gas supply.

Therefore, it is necessary to provide a measuring apparatus or measuring method for measuring the wafer carrier C to determine whether the gas supply function of the wafer carrier C is abnormal.

SUMMARY OF THE INVENTION

It is an objective of the present invention to preclude measurement errors of gas flow in a wafer carrier manually measured.

Another objective of the present invention is to resolve problems such as a deficiency of manual assembly of the gas towers GT within the wafer carrier C which may result uneven gas supply, and even more lead to the problem of poor gas supply effectiveness due to gas leakage.

Given the above, the present invention provides a measuring apparatus for measuring a wafer carrier having an opening end and at least one gas tower equipped inside, the measuring apparatus includes a carrying interface for securing the wafer carrier in place. The opening end of the wafer carrier faces an inspection space of the measuring apparatus. The carrying interface has a gas supplying assembly connected to a base of the wafer carrier so as to supply gas to the wafer carrier. The internal of the inspection space accommodates therein a measuring assembly for measuring gas flow rate from the gas tower in the accommodating space. The measuring assembly comprises a plurality of wind speed sensing elements and a plurality of displacement sensing elements which are fitted to a second connecting element.

In an embodiment of the present invention, the measuring assembly comprises a first connecting element, a plurality of second connecting elements connected to the first connecting element, and a plurality of wind speed sensing elements disposed on the plurality of second connecting elements, so as to measure gas flow from the gas tower at different height levels.

In an embodiment of the present invention, the measuring assembly further comprises at least one displacement sensing element configured to recognize the heights and positions of the gas tower.

In an embodiment of the present invention, the displacement sensing element is a photographic element, a laser sensing element or a non-contact sensing element.

In an embodiment of the present invention, the wind speed sensing elements are at least disposed at the bottom end of the first connecting element to measure gas flow from the gas tower at the bottom portion of the accommodating space.

In an embodiment of the present invention, each wind speed sensing elements has a sensing stick and a sensing wire, wherein the sensing wire is a metal wire which is heatable.

In an embodiment of the present invention, the carrying interface comprises a positioning structure for aligning and positioning the wafer carrier, and a gas supplying assembly for supplying the gas to the gas tower.

In an embodiment of the present invention, the positioning structure comprises a pair of positioning posts for fitting a base of the wafer carrier.

In an embodiment of the present invention, the wafer carrier measuring apparatus further comprises a control interface for operating the measuring assembly and observing a measurement state of the gas tower.

In an embodiment of the present invention, the measuring assembly is connected to a moving unit in the inspection space, and the measuring assembly is driven into the accommodating space of the wafer carrier by the moving unit when the wafer carrier is secured to the carrying interface.

DETAILED DESCRIPTION OF THE EMBODIMENTS

Figure 1A:
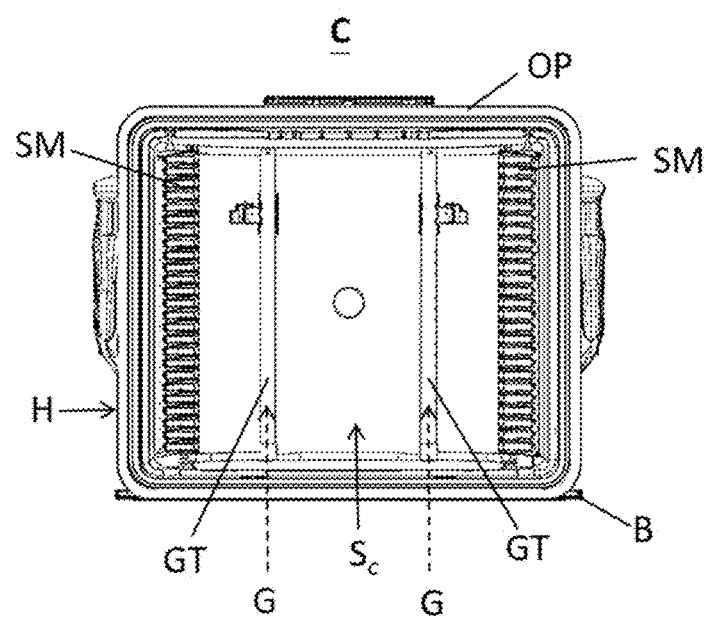
FIG. 1A (PRIOR ART) shows a front view of a conventional wafer carrier.
Figure 1B:
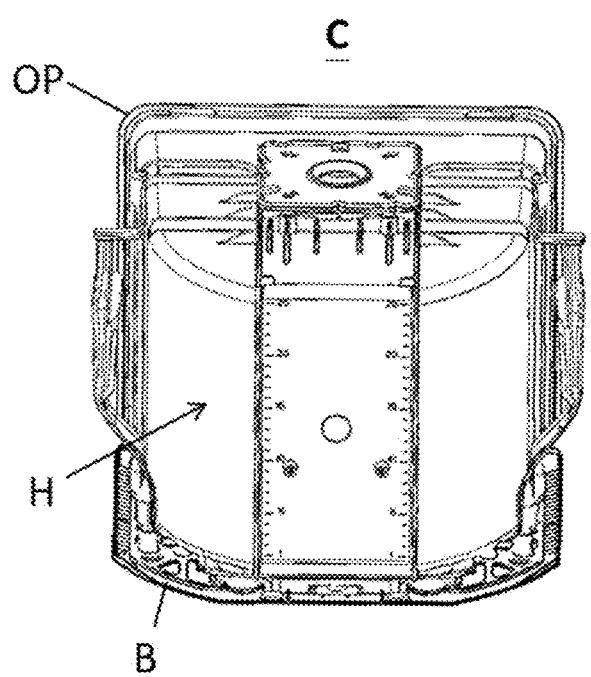
FIG. 1B (PRIOR ART) shows a rear view of the conventional wafer carrier.
Figure 2:
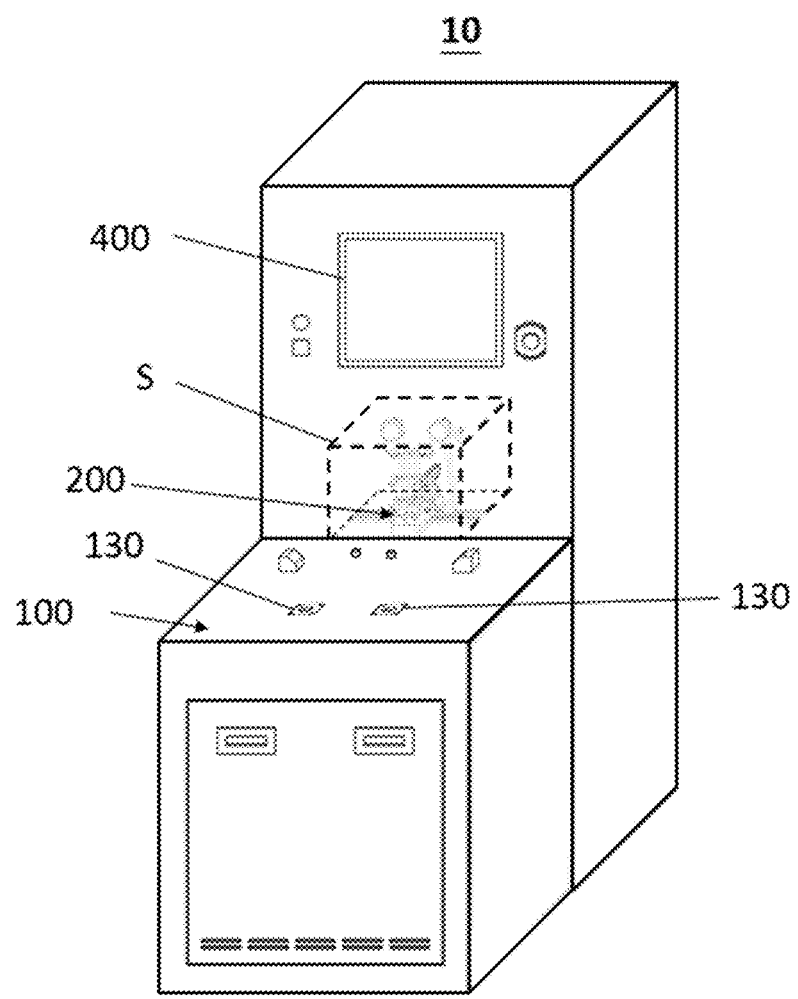
FIG. 2 shows a perspective view of a wafer carrier measuring apparatus of the present invention.

Referring to FIG. 2 shows a wafer carrier measuring apparatus 10 of the present invention, which is disposed for measuring a wafer carrier C with an opening end OP shown in FIG. 1A and FIG. 1B. The wafer carrier measuring apparatus 10 essentially comprises a carrying interface 100, a measuring assembly 200 disposed in an inspection space S, and a control interface 400. The carrying interface 100 carries and positions the wafer carrier C and supplies a gas to an accommodating space $S_C$ of the wafer carrier C. The carrying interface 100 provides a position-limiting means for positioning the wafer carrier C and multiple nozzles for supplying the gas. The position-limiting means comprises multiple positioning pins (not shown) operating in conjunction with a base B of the wafer carrier C. The nozzles operate in conjunction with inlet valves or inlet modules of the base B so that the gas can be introduced into a gas tower GT in the wafer carrier C. The inspection space S has an opening. A plane defined by the opening is perpendicular to the carrying interface 100. In this embodiment, the opening is substantially formed on a vertical side of the housing H, allowing the inspection space S to face the opening end OP disposed at the wafer carrier C and positioned proximate to the carrying interface 100 and be in communication with the accommodating space $S_C$. The measuring assembly 200 is movably accommodated in the inspection space S. The wafer carrier measuring apparatus 10 controls the movement of the measuring assembly 200 so that the measuring assembly 200 is movable from the inspection space S into the accommodating space $S_C$ of the wafer carrier C. When the carrying interface 100 supplies the gas to the accommodating space $S_C$ of the wafer carrier C, the measuring assembly 200 measures at different height levels respectively so as to measure the data of the gas flow generated at different heights of the gas tower GT in the accommodating space $S_C$. The control interface 400 enables a user to adjust the displacement of the measuring assembly 200, enter the data of the measurement criteria of the gas, observe the assembly state and measurement state of the gas tower GT, and display the measurement results.

In another embodiment, the measuring assembly 200 is immovably accommodated in the inspection space S, and the carrying interface 100 comprises a movement means whereby the wafer carrier C disposed on the carrying interface 100 is pushed into the inspection space S to attain a predetermined detection position. The measuring assembly 200 is described in detail later.

Figure 3:
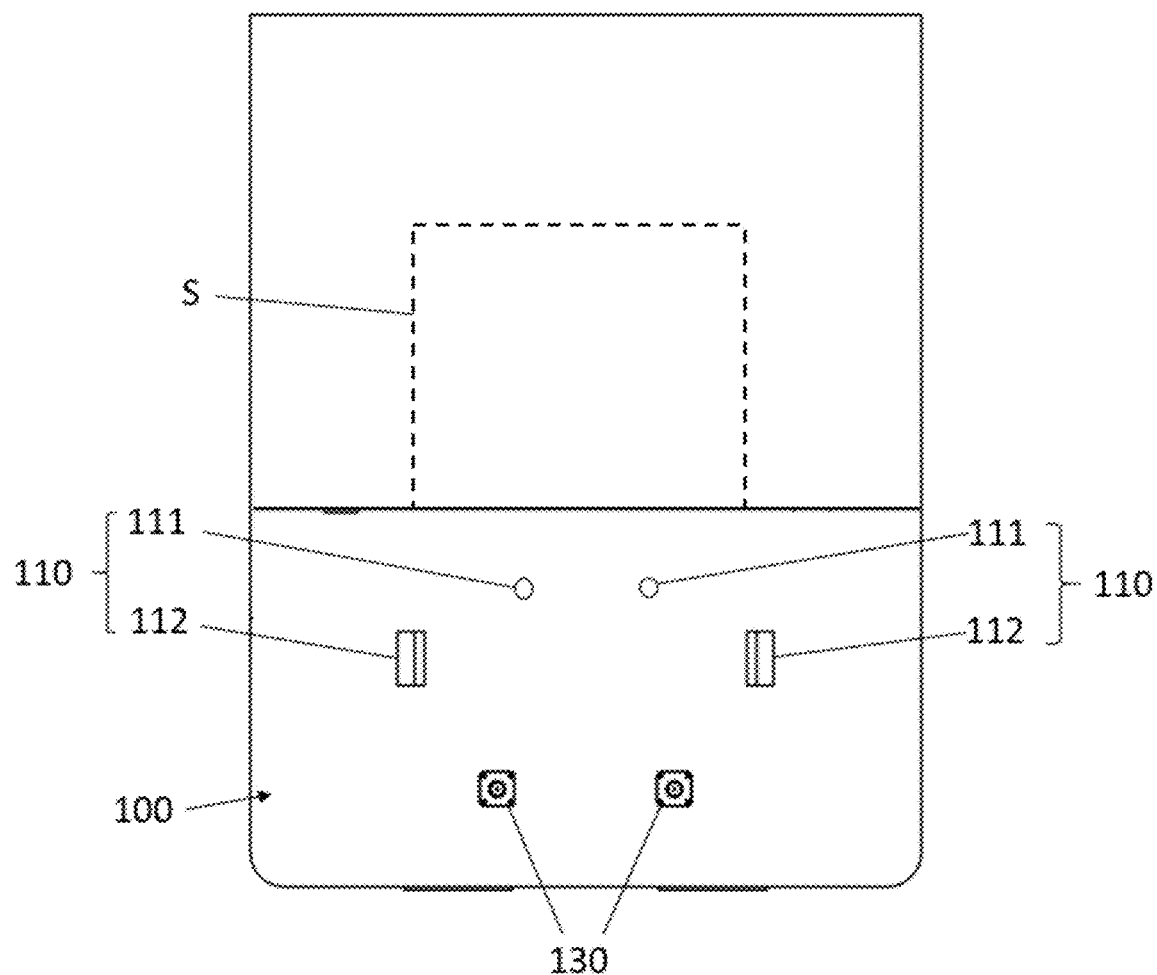
FIG. 3 shows a top view of the wafer carrier measuring apparatus of the present invention.

Referring to FIG. 3 shows a top view of the wafer carrier measuring apparatus 10 of the present invention. As shown in the diagram, the carrying interface 100 of the wafer carrier measuring apparatus 10 has a plurality of positioning structures 110 and gas supplying assemblies 130. The positioning structures 110 cause the base B of the wafer carrier C to be aligned with and positioned on the carrying interface 100. The gas supplying assemblies 130 supply the gas to the inlet valves or the inlet modules of the base B of the wafer carrier C to fill the gas into the accommodating space $S_C$. Basically, the gas supplying assemblies 130 comprises nozzles corresponding in number to the inlet modules of the base B, for example, nozzles capable of abutting against and holding the base B to achieve airtightness.

In an embodiment of the present invention, the positioning structures 110 at least have a pair of positioning block 111 and a pair of positioning post 112, the positioning blocks 111 and the positioning posts 112 separately operate in conjunction with corresponding dent structures in position to the base B of the wafer carrier C, thereby preventing the wafer carrier C from sliding and shifting on the carrying interface 100, and allowing the two inlet valves of the base B of the wafer carrier C to be aligned with the two gas supplying assemblies 130 of the carrying interface 100, and allowing the opening end OP of the wafer carrier C to face the inspection space S, and allowing the inspection space S to be in communication with the accommodating space $S_C$ of the wafer carrier C.

The gas supplying assemblies 130 are connected to a gas supply system embeddedly disposed under the carrying interface 100, and thus the wafer carrier measuring apparatus 10 enables the gas to be supplied to the accommodating space SC of the wafer carrier C via the components such as the gas supplying assemblies 130 and the inlet valves and the gas tower GT in the wafer carrier C. In the embodiment, the positioning structures 110 and the gas supplying assemblies 130 are detachably disposed on the carrying interface 100, so that the number and position of the positioning structures 110 and the gas supplying assemblies 130 can be changed to allow the wafer carrier measuring apparatus 10 to measure different wafer carriers. The carrying interface 100 further comprises a gas discharging component (not shown in the diagrams) for discharging the gas from the accommodating space SC of the wafer carrier C. According to the configuration of the present invention, the measuring assembly 200 can carry out measurement by the gas supply operation of the gas supplying assemblies 130.

Figure 4:
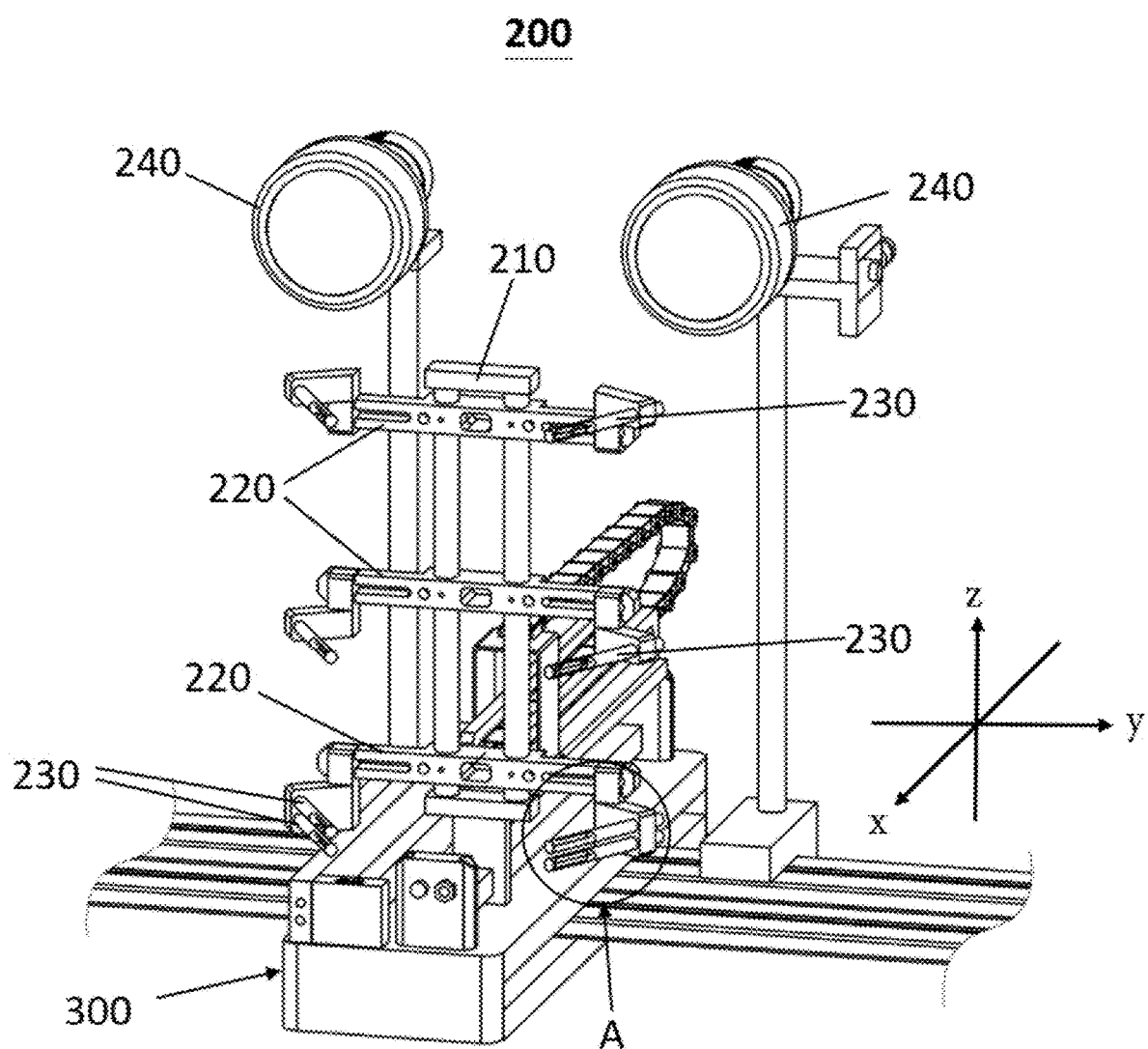
FIG. 4 shows a perspective view of a measuring assembly of the present invention.
Figure 5:
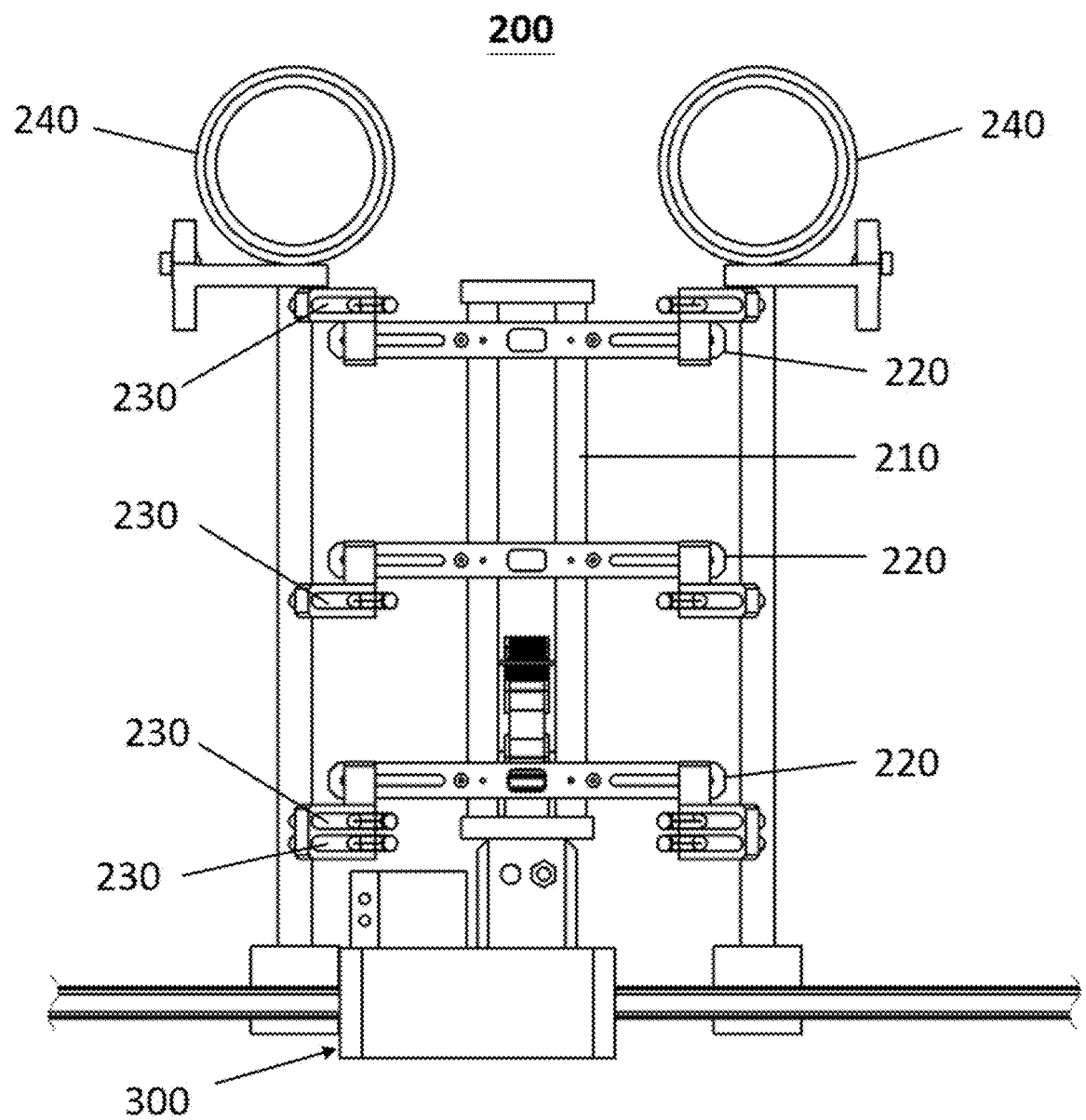
FIG. 5 shows a front view of the measuring assembly of the present invention.

Referring to FIG. 4 and FIG. 5, a perspective view and a front view of the measuring assembly 200 are shown respectively. The measuring assembly 200 is disposed in the inspection space S of the wafer carrier measuring apparatus 10 and is mounted on a moving unit 300. The measuring assembly 200 has a first connecting element 210 fixed to the moving unit 300, a plurality of second connecting elements 220 connected to the first connecting element 210, at least one pair of wind speed sensing elements 230 symmetrically connected to the second connecting elements 220 and facing the accommodating space $S_C$ of the wafer carrier C, and a plurality of displacement sensing elements 240 disposed in the inspection space S. The displacement sensing elements 240 are disposed in a position that does not affect the position of the wind speed sensing elements 230 during the measurement, and are disposed to face the accommodating space $S_C$ of the wafer carrier C.

Specifically, the first connecting element 210 is a tower-shape structure essentially comprising one or more posts and is connected to a moving unit 300. By the displacement of the moving unit 300, the moving unit 300 drives the plurality of second connecting elements 220 and the plurality of wind speed sensing elements 230 to move along x-y axes. Each one of the plurality of second connecting elements 220 is a horizontal beam structure connected to the first connecting element 210, and is equipped with at least one pair of wind speed sensing elements 230. The second connecting elements 220 and the first connecting element 210 have an interconnection configuration (not shown). For instance, the second connecting elements 220 each have a positioning hole which can be passed through by a positioning post of the first connecting element 210, and the second connecting elements 220 can be positioned at different vertical positions of the first connecting element 210 by a fixing means. Therefore, the second connecting elements 220 are properly adjusted according to the height and position required for the measurement carried out with the wind speed sensing elements 230. Once the wafer carrier C is placed on the wafer carrier measuring apparatus 10, the moving unit 300 drives the plurality of wind speed sensing elements 230 to appropriately enter the accommodating space $S_C$ of the wafer carrier C to measure the gas flow from the gas tower GT.

The plurality of displacement sensing elements 240 are disposed in a space that does not interfere with measurement to access information for determining whether the gas towers GT of the wafer carrier C are mounted in place at the same height or tilted. The displacement sensing elements 240 are preferably positioned proximate to the top portion of the accommodating space $S_C$. The displacement sensing elements 240 are implemented as non-contact displacement sensing elements, such as photographic elements and laser sensing elements, but the present invention is not limited thereto. In an embodiment of the present invention, each displacement sensing elements 240 (for example, camera elements) has a lens and a photosensitive element. Each camera element corresponds in position to the gas towers GT in the wafer carrier C for determining the heights and positions of the gas towers GT by image recognition, so as to determine whether the gas towers GT are correctly mounted in place.

Figure 6:
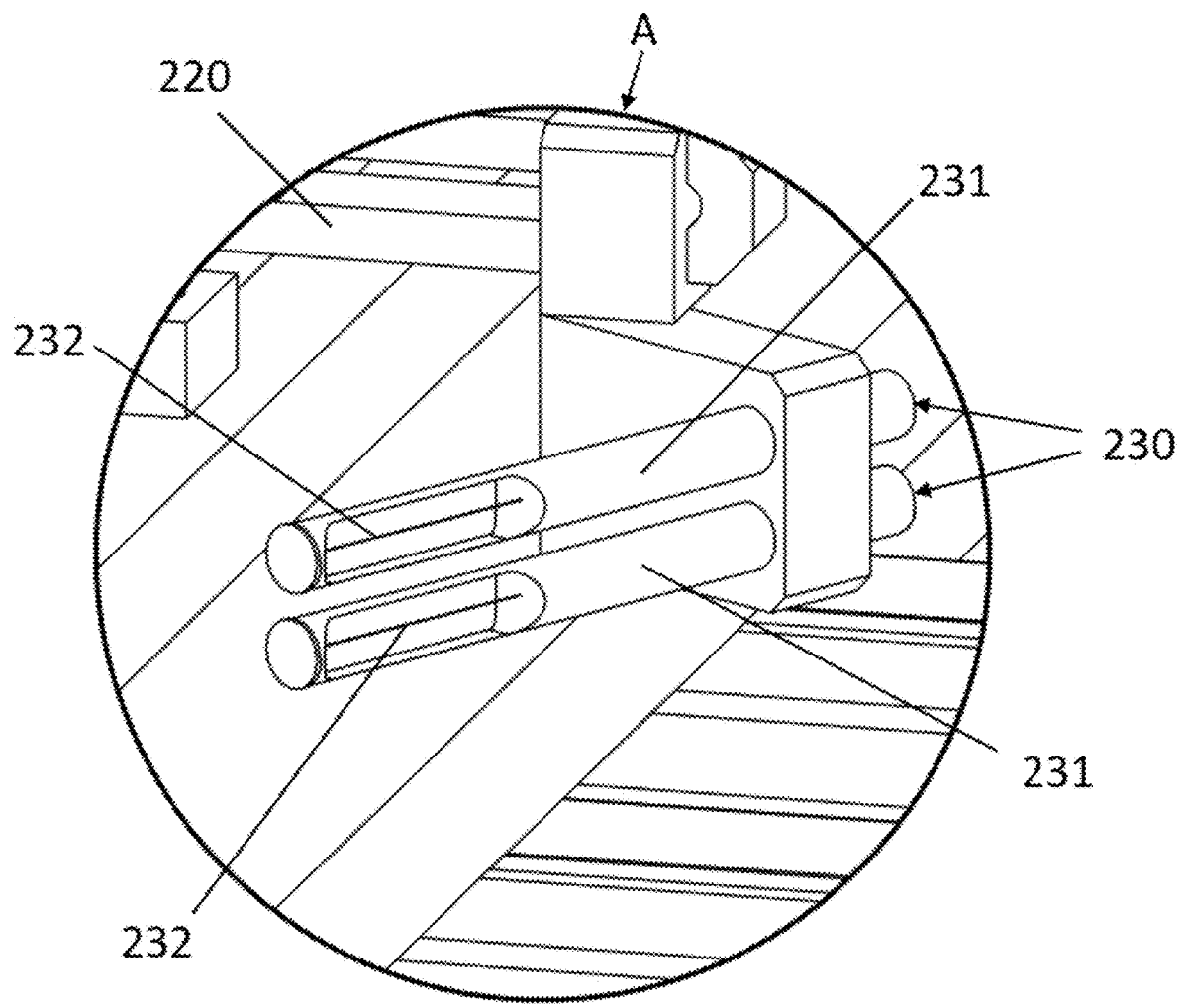
FIG. 6 shows an enlarged view of portion A in FIG. 4.
Figure 7:
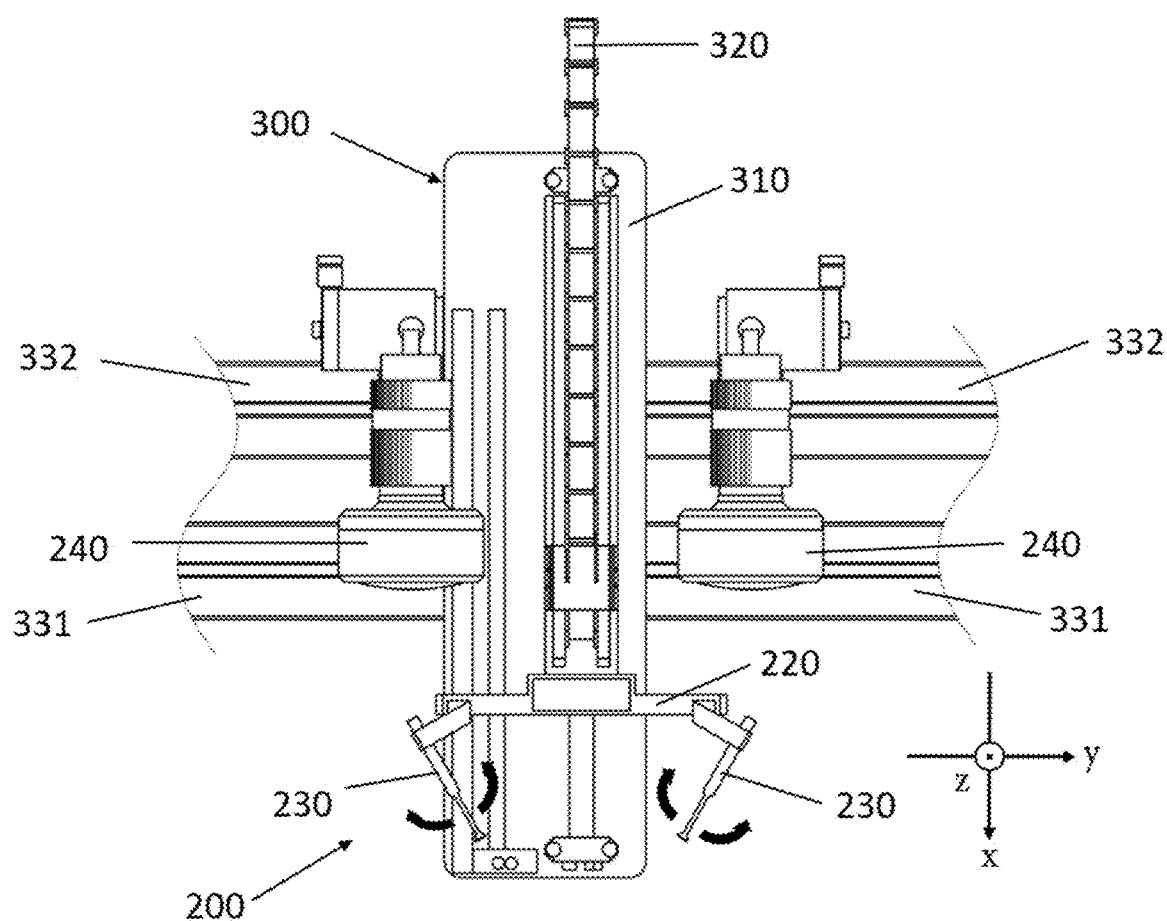
FIG. 7 shows a top view of the measuring assembly of the present invention.

Referring to FIG. 6 an enlarged perspective view of the wind speed sensing elements 230 of the present invention is shown, and to FIG. 7 a top view of the measuring assembly 200 is shown, to illustrate the wind speed sensing elements 230 of the present invention. Each wind speed sensing elements 230 is pivotally disposed at one end of the second connecting elements 220, that is, each pair of wind speed sensing elements 230 is connected to the two ends of each second connecting elements 220, thereby allowing each pair of wind speed sensing elements 230 to correspond in height to different heights of the gas towers GT in the wafer carrier C. The wind speed sensing elements 230 are capable of undergoing pivotal rotation to adjust the orientation of each pair of wind speed sensing elements 230 (see FIG. 7). The pivotal rotation mechanism enables each pair of wind speed sensing elements 230 to lie on a preferred gas flow path, allowing each pair of wind speed sensing elements 230 to be positioned at different heights to accurately receive gas flow from the gas towers GT and measure the data of gas flow.

In other embodiments, the number of the wind speed sensing elements 230 can be adjusted according to the number of the gas towers GT in the wafer carrier C; however, the present invention is not limited thereto, as any number of the wind speed sensing elements 230 will be acceptable as long as the wind speed sensing elements 230 are able to measure gas flow data generated at different heights of the gas towers GT in the wafer carrier C. For example, when the gas towers GT in the wafer carrier C are in the number of three, the second connecting elements 220 can be appropriately arranged and thus come with three wind speed sensing elements 230, respectively, allowing the three wind speed sensing elements 230 to receive gas flow from the three gas towers GT, respectively.

In an embodiment of the present invention, the wind speed sensing elements 230 are each a hot-wire anemometer and each include a sensing stick 231 and a sensing wire 232 disposed and exposed at one end of the sensing stick 231. The sensing wire 232 is a metal wire that can be heated up. The wind speed sensing elements 230 measure the gas flow rate of the gas discharged from the gas towers GT at different heights, respectively. In other embodiments, the wind speed sensing elements 230 are each implemented as an ultrasonic anemometer, a vane anemometer or a radar anemometer. In a preferred embodiment of the present invention, since the bottom portion of the accommodating space $S_C$ of the wafer carrier C is structurally complicated, and thus it is necessary for at least one wind speed sensing element 230 to be positioned proximate to the gas tower GT to sense the height of the bottom portion of the accommodating space $S_C$ in order to use the measured wind speed data to determine whether the wafer carrier C is installed properly or damaged to the detriment of gas feeding efficiency. The positions of the other wind speed sensing elements 230 measuring wind speed are adjustable and vary from the wafer carrier C to the wafer carrier C or from a measurement criterion to a measurement criterion, for example, adjusting the height level of each pair of wind speed sensing elements 230 or the distance between every two paired wind speed sensing elements 230.

Figure 8:
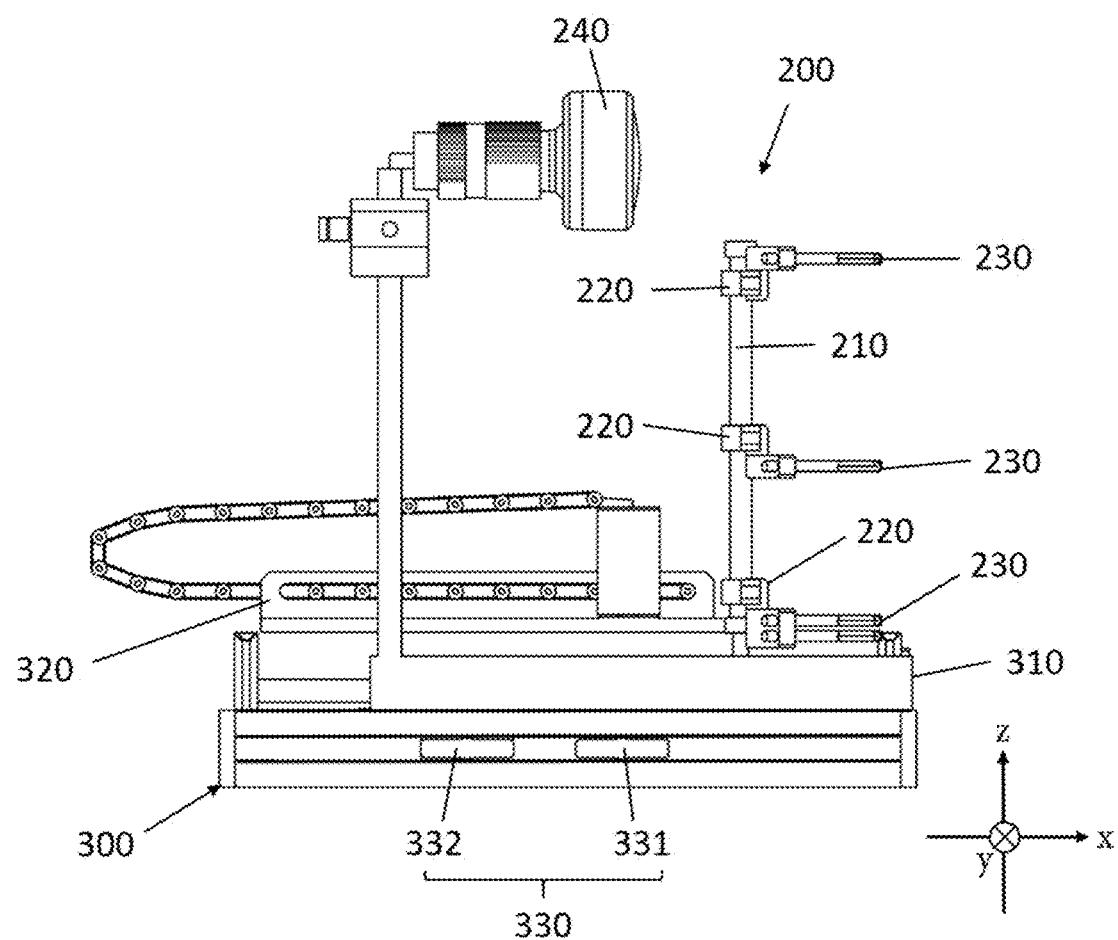
FIG. 8 shows a lateral view of the measuring assembly of the present invention.

Referring to FIG. 7 a top view of the measuring assembly 200 is shown. Referring to FIG. 8 a lateral view of the measuring assembly 200 is shown. Both diagrams illustrate the relationship between the measuring assembly 200 and the moving unit 300. The measuring assembly 200 is mounted on the moving unit 300. The measuring assembly 200 is moved along x-axis by the moving unit 300 so as to enter the accommodating space $S_C$ of the wafer carrier C, and the measuring assembly 200 is moved along y-axis by the moving unit 300 so as to further adjust its position inside the accommodating space $S_C$. The moving unit 300 has a first movement mechanism 310, a second movement mechanism 320 and a plurality of guide rails 330. The first movement mechanism 310 mainly carries the second movement mechanism 320 and moves in the y-axis along the plurality of guide rails 330. In a preferred embodiment of the present invention, the plurality of guide rails 330 at least include a first guide rail 331 and a second guide rail 332. The first guide rail 331 and the second guide rail 332, parallel to each other, are arranged on a horizontal plane and passed through the first movement mechanism 310, so that the first movement mechanism 310 precisely moves in the y-axis along the first guide rail 331, the second guide rail 332. In other embodiments, the present invention may also use only one rail to achieve the displacement of the first movement mechanism 310 in the y-axis. The second movement mechanism 320 is connected to the first movement mechanism 310, and is driven by a motor and a transmission mechanism, causing the measuring assembly 200 to move toward or away from the accommodating space $S_C$ of the wafer carrier C. The second movement mechanism 320 moves along a guide rail (not shown in the diagrams) on the first movement mechanism 310 to drive the measuring assembly 200 moving along x-axis, so that the measuring assembly 200 can enter the accommodating space $S_C$ of the wafer carrier C. In an embodiment of the present invention, the displacement sensing elements 240 of the measuring assembly 200 are disposed on the first movement mechanism 310, and the displacement of the displacement sensing elements 240 along y-axis can be synchronously adjusted with the displacement of the first movement mechanism 310 based on the demand for sensing internal components of the wafer carrier C. In other embodiments of the present invention, the displacement sensing elements 240 are disposed on the second connecting elements 220 or the second movement mechanism 320. Without interfering with the measurement operation of the wind speed sensing elements 230, the displacement sensing elements 240 move with the second connecting elements 220 or the second movement mechanism 320, thereby adjusting the distance of the displacement in x-axis and z-axis to meet the demand for sensing internal components of the wafer carrier C.

Figure 9:
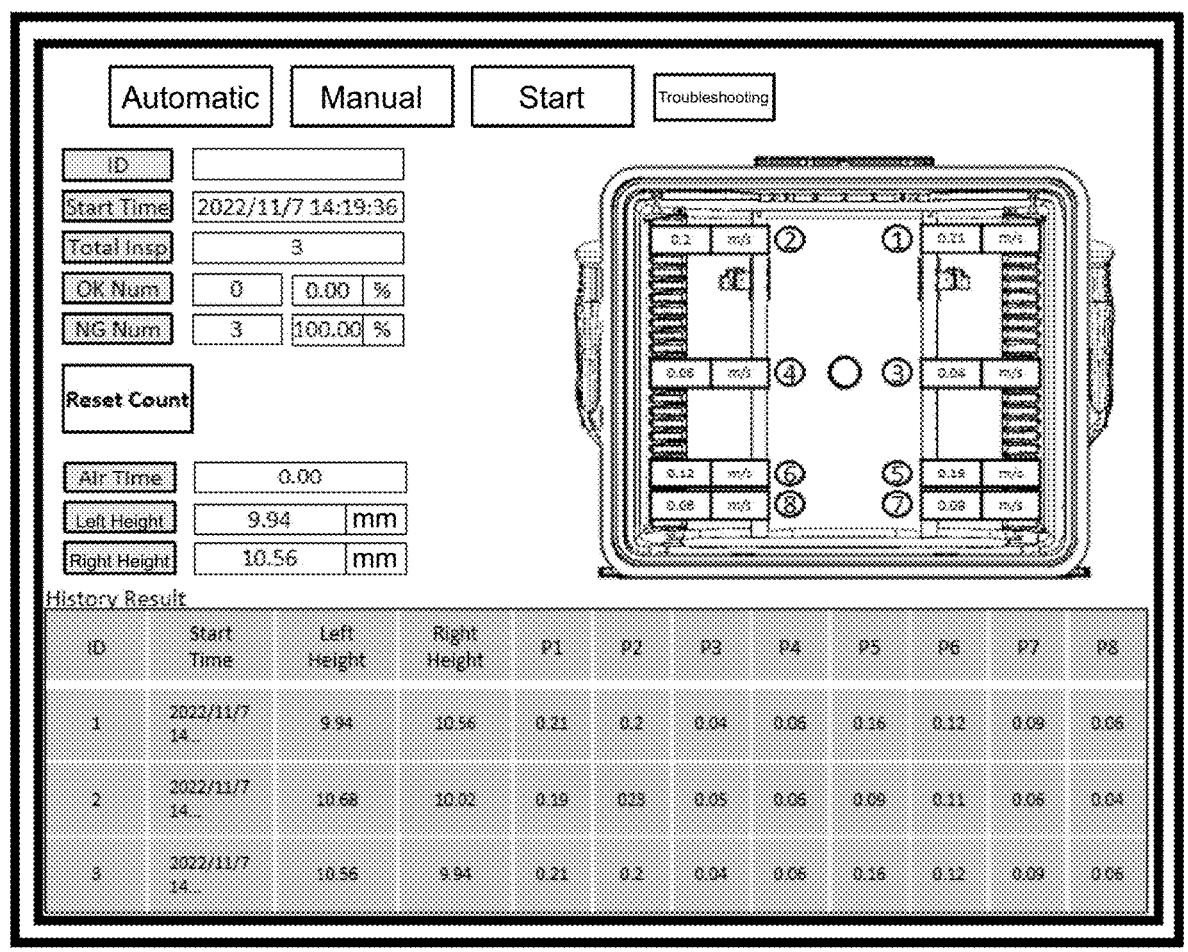
FIG. 9 shows a state measured within wafer carrier according to the present invention.

When the wafer carrier measuring apparatus 10 starts to measure, the user uses an operating means (for example, a button, a joystick or an application in the control interface 400, but the present invention is not limited thereto) to control the moving unit 300 for moving the measuring assembly 200 from the inspection space S into the accommodating space $S_C$ of the wafer carrier C so as to measure the data of wind speed. Meanwhile, the displacement sensing elements 240 of the measuring assembly 200 utilizes image recognition to determine the individual positions and individual heights of the gas towers GT. Referring to FIG. 9 showing a schematic view of the control interface 400 displaying the data of wind speed according to the present invention. In a specific embodiment of the present invention, the user can set the "Air Time" by the control interface 400, thereby setting the duration of supplying the gas into the accommodating space $S_C$ of the wafer carrier C from the gas supplying assemblies 130 of the carrying interface 100 and setting the number of the inspection (Total Insp) of the wind speed sensing elements 230. Thus, the wind speed sensing elements 230 can measure the wind speed from the corresponding position 1 (P1) to position 8 (P8) within the accommodating space $S_C$, thereby measuring the distribution of overall flow fields in the wafer carrier C, and obtaining the individual height of the gas towers GT by the displacement sensing elements 240, for example, "Left Height" and "Right Height" in the table "History Result". FIG. 9 shows the data of wind speed, which separately displays the heights of the gas towers GT from three wafer carriers C, the user can determine whether the function of the wafer carriers C are abnormal accordingly. In other embodiments of the present invention, the user can set the predetermined height values of the heights of the gas towers GT. When the measured data exceeds an error range, the wafer carrier measuring apparatus 10 will automatically determine whether the function of the wafer carriers C are abnormal, and further informs the user of the abnormality of the gas towers GT. Furthermore, if the difference in wind speed between position 1 (P1) and position 2 (P2) or the difference in wind speed between position 7 (P7) and position 8 (P8) exceeds an error range, the wafer carrier measuring apparatus 10 will automatically determine that the function of the wafer carriers C are abnormal, and further informs the user of the positions at which the wind speed is abnormal.

In a variant embodiment of the present invention, as illustrated with FIG. 4, in the measuring assembly 200, the second connecting elements 220 are vertically movably connected to the first connecting element 210, whereas the wind speed sensing elements 230 are horizontally slidably connected to the second connecting elements 220 and are pivotable. The first connecting element 210 and the second connecting elements 220 are implemented as sliding rails or ball screws, whereas the pivot of the wind speed sensing elements 230 can be implemented by a gear structure at least. The first connecting element 210, second connecting elements 220, wind speed sensing elements 230, displacement sensing elements 240 and moving unit 300 are electrically connected to a processing unit (not shown). When the displacement sensing elements 240 locate the center line of the wafer carrier C by image recognition, and more specifically, the displacement sensing elements 240 use the supporting elements SM and the gas towers GT of the wafer carrier C in different images as feature values to calculate the center line of the wafer carrier C. After the center line of the wafer carrier C is located, the displacement sensing elements 240 transmit relevant data to the processing unit, and then the processing unit controls the moving unit 300 moving along x-y axes until the measuring assembly 200 reaches the inspection position. Next, the processing unit, based on the positions and heights of the gas towers GT as sensed by the displacement sensing elements 240, controls the height levels of each second connecting elements 220 disposed on the first connecting element 210 and controls the spacing between each pair of wind speed sensing elements 230 on the second connecting elements 220, so that the wind speed sensing elements 230 can move to a precise inspection position, for example, position 1 (P1) to position 8 (P8) as shown in FIG. 9. After that, the wafer carrier measuring apparatus 10 provides gas into the inside of the wafer carrier C with a predetermined duration, and the processing unit controls the opening and closing angle of each pair of wind speed sensing elements 230 so as to find out the opening and closing angle during the maximum wind speed as the initial position of the wind speed sensing elements 230. According to aforementioned operational procedure, the present invention is effective in automatically calibrating the inspection position of the measuring assembly 200 to measure the wafer carrier C, which can effectively measure flow distribution and observe the precision of installation of the gas towers GT, and can further quickly identify the aforesaid abnormality issue based on the measurement results. Consequently, it resolves problems such as a deficiency of manual assembly of the gas towers GT within the wafer carrier C may result uneven gas supply, and even leading to the problem of poor gas supply effectiveness due to gas leakage.

Overall, the wafer carrier measuring apparatus of the present invention can easily and precisely measure the state of gas flow from the gas tower in the wafer carrier so as to determine whether the function of the wafer carrier is abnormal.

What is claimed is:

1. A wafer carrier measuring apparatus for measuring a wafer carrier having an opening end and having therein at least one gas tower equipped, the wafer carrier measuring apparatus comprising:

a carrying interface for securing the wafer carrier in place and supplying a gas to an accommodating space of the wafer carrier, the accommodating space being in communication with plural gas discharging holes of the gas tower; and a measuring assembly movably accommodated within an inspection space corresponding in position to the opening end, wherein, the measuring assembly moves from the inspection space into the accommodating space and measures data of gas flow of the gas tower at different height levels when the wafer carrier being secured to the carrying interface and the carrying interface supplying the gas into the accommodating space of the wafer carrier.

2. The measuring apparatus of claim 1, wherein the measuring assembly comprises:
   a first connecting element;
   a plurality of second connecting elements connected to the first connecting element, and the second connecting elements vertically and spaced from each other; and
   a plurality of wind speed sensing elements disposed on the plurality of second connecting elements for measuring gas flow from the gas tower at different height levels.

3. The measuring apparatus of claim 2, wherein at least one of the plurality of wind speed sensing elements is posited at same height as a bottom end of the first connecting element for measuring the gas flow from the gas tower at a bottom portion of the accommodating space.

4. The measuring apparatus of claim 2, wherein the wind speed sensing elements each have a sensing stick and a sensing wire, wherein the sensing wire is a heatable metal wire.

5. The measuring apparatus of claim 2, further comprising a control interface for operating the measuring assembly and observing a measurement state of the gas tower.

6. The measuring apparatus of claim 1, wherein the measuring assembly further comprises:
   at least one displacement sensing element configured to recognize a height and position of the gas tower.

7. The measuring apparatus of claim 6, wherein the displacement sensing element is one of a photographic element, a laser sensing element and a non-contact sensing element.

8. The measuring apparatus of claim 1, wherein the carrying interface comprises:
   a positioning structure for aligning and positioning the wafer carrier; and
   a gas supplying assembly for supplying gas to the gas tower.

9. The measuring apparatus of claim 8, wherein the positioning structure comprises a pair of positioning posts for fitting a base of the wafer carrier.

10. The measuring apparatus of claim 1, wherein the measuring assembly is connected to a moving unit in the inspection space, and the measuring assembly is driven into the accommodating space of the wafer carrier by the moving unit when the wafer carrier is secured to the carrying interface.

\* \* \* \* \*